(12) United States Patent
Yamasawa et al.

(10) Patent No.: US 10,337,120 B2
(45) Date of Patent: Jul. 2, 2019

(54) ALUMINA SUBSTRATE

(71) Applicant: TDK CORPORATION, Tokyo (JP)

(72) Inventors: Kazuhito Yamasawa, Tokyo (JP); Atsushi Ohido, Tokyo (JP); Katsumi Kawasaki, Tokyo (JP)

(73) Assignee: TDK CORPORATION, Tokyo (JP)

(*) Notice: Subject to any disclaimer, the term of this patent is extended or adjusted under 35 U.S.C. 154(b) by 163 days.

(21) Appl. No.: 15/329,304

(22) PCT Filed: Aug. 6, 2015

(86) PCT No.: PCT/JP2015/072316
§ 371 (c)(1),
(2) Date: Jan. 26, 2017

(87) PCT Pub. No.: WO2016/024515
PCT Pub. Date: Feb. 18, 2016

(65) Prior Publication Data
US 2017/0218535 A1    Aug. 3, 2017

(30) Foreign Application Priority Data

Aug. 12, 2014    (JP) ................. 2014-164068

(51) Int. Cl.
*C30B 29/40* (2006.01)
*C30B 19/12* (2006.01)
(Continued)

(52) U.S. Cl.
CPC .............. *C30B 29/403* (2013.01); *C30B 1/02* (2013.01); *C30B 1/10* (2013.01); *C30B 19/12* (2013.01); *C30B 25/18* (2013.01); *C30B 29/20* (2013.01); *C30B 29/38* (2013.01); *H01L 21/0242* (2013.01); *H01L 21/0254* (2013.01); *H01L 21/02439* (2013.01); *H01L 21/02458* (2013.01); *H01L 21/02488* (2013.01); *H01L 21/02491* (2013.01); *H01L 21/02502* (2013.01); *H01L 21/02614* (2013.01); *H01L 21/02658* (2013.01)

(58) Field of Classification Search
USPC .................. 428/336, 698, 701, 702; 117/952
See application file for complete search history.

(56) References Cited

U.S. PATENT DOCUMENTS 4,152,182 A * 5/1979 Rutz ..................... C09K 11/64
                                                                117/952
5,096,860 A * 3/1992 Nadkarni ............ C22C 32/0068
                                                                117/952
(Continued)

FOREIGN PATENT DOCUMENTS

JP    H03-193681 A    8/1991
JP    H09-92881 A     4/1997
(Continued)

OTHER PUBLICATIONS

Yibas et al "Laser carbonitriding of alumina surface" Optics & Lasers in Engineering 49 (2011) p. 341-350. (Year: 2011).*
(Continued)

*Primary Examiner* — Archene A Turner
(74) *Attorney, Agent, or Firm* — Oliff PLC (57) ABSTRACT

An alumina substrate having a carbon-containing phase with an AlN layer formed on a surface of the alumina substrate.

17 Claims, 5 Drawing Sheets

(51) Int. Cl.
  *C30B 25/18* (2006.01)
  *C30B 29/38* (2006.01)
  *C30B 1/02* (2006.01)
  *C30B 1/10* (2006.01)
  *C30B 29/20* (2006.01)
  *H01L 21/02* (2006.01)

(56) References Cited

U.S. PATENT DOCUMENTS

| | | | |
|---|---|---|---|
| 5,246,741 | A | 9/1993 | Ouhata et al. |
| 6,744,076 | B2 * | 6/2004 | Fukuyama .............. C30B 25/02 257/103 |
| 2006/0175619 | A1 | 8/2006 | Fukuyama et al. |
| 2010/0285236 | A1 * | 11/2010 | Yilbas .................. C04B 41/009 427/554 |

FOREIGN PATENT DOCUMENTS

| | | | |
|---|---|---|---|
| JP | 2003-192494 A | 7/2003 |
| JP | 4457576 B | 11/2004 |
| JP | 2006-213586 A | 8/2006 |
| JP | 4907127 B | 3/2007 |

OTHER PUBLICATIONS

Nov. 10, 2015 International Search Report issued in International Patent Application No. PCT/JP2015/072316.

Nov. 10, 2015 Written Opinion issued in International Patent Application No. PCT/JP2015/072316.

Feb. 14, 2017 International Preliminary Report on Patentability issued in International Patent Application No. PCT/JP2015/072316.

\* cited by examiner

ALUMINA SUBSTRATE

The present invention related to an alumina substrate on the main surface of which an aluminum nitride layer is disposed.

BACKGROUND

In the present invention, a substrate made by α-alumina ($Al_2O_3$) single crystal (hereinafter, it is called as sapphire) is called as sapphire substrate, and a substrate made by polycrystalline alumina ($Al_2O_3$) is called as polycrystalline alumina substrate. The sapphire substrate and the polycrystalline alumina substrate are both called as alumina substrate.

A crystalline layer made of a group III nitride semiconductor such as gallium nitride (GaN), aluminum nitride (AlN) or aluminum gallium nitride (AlGaN) or the like is noted as a functional layer constituting a light emitting device and a power transistor of a light emitting diode or a laser diode or the like which emit a short-wavelength light in the range of blue color to ultraviolet. Further, AlN is also a material which can be expected to be used as a heat dissipation material making use of the high thermal conductivity.

For these crystalline layers, methods are proposed where multi-layered thin-film layers are deposited using vapor deposition methods such as molecular beam epitaxy method or metal organic chemical vapor deposition method or the like on a substrate of such as sapphire or SiC single crystal or the like. However, there is some discrepancy between the lattice constants or the thermal expansion coefficients of the substrate material and the semiconductor crystals, thus, defects or deformation with high density will be introduced during the deposition process. As a result, it will bring decrease in the energy efficiency of the semiconductor element, shortening in the lifetime of the element, inferiority in the property and reduction of yield due to crack.

As a method to solve the problem, substrates with same materials which are excellent in lattice matching are discussed. For example, respect to the crystalline layer of AlGaN containing large amount of Al, different methods are discussed, such as sublimation methods on the substrates of sapphire or SiC single crystal, vapor deposition methods such as hydride vapor deposition method (HVPE) or the like, or methods in which AlN crystal is obtained by flux method. Further, it is desired to deposit a crystalline layer of AlGaN on the independent substrate of AlN single crystal, wherein, the independent substrate of AlN single crystal is obtained by eliminating the substrate of sapphire or the SiC single crystal or the like by milling. Thus, it is required that the AlN crystal grows to a thickness of 100 µm or more preferably. However, due to the growth on different substrates, internal distortions are accumulated; defects, cracks or warping are included. Thereby, different countermeasures are discussed.

As one of the countermeasures, a method of further growing an AlN single crystal on the independent substrate is proposed. By this method, the quality is expected to be improved; but the process is too complex so that the cost is increased. Thus, there is a problem that the utility value in the industry is decreased.

Further, as other methods, Patent Document 1 discloses a method of preparing an AlN layer on the surface of a sapphire substrate by nitriding the surface of a sapphire substrate. In this method, a $N_2$—CO mixed gas is introduced into the heat-treating part disposed with a sapphire substrate and graphite while the composition of the mixed gas is adjusted at the same time. An AlN layer of 5 to 20 nm can be obtained by heat-treating under 1675° C. The mismatching of the crystal lattice between the sapphire substrate and the AlN single crystal film can be eased through a transition layer and thus the threading dislocation can be prevented from occurring which is inevitable in the conventional AlN single crystal film.

PATENT DOCUMENTS

Patent Document 1: JP-A-2006-213586

SUMMARY

In the nitriding process of the surface of the sapphire substrate mentioned above, even though the lattice mismatching can be eased through a transition layer, the controlling of the transition layer is difficult. Further, the thickness of the AlN layer is as thin as 5 to 20 nm, thus, when AlN crystal is grown on the AlN layer with the AlN layer being a template substrate using sublimation methods, HVPE method or flux method, influence is easy to be brought to the grain growth due to the lattice mismatching of the sapphire substrate of the base and the thermal expansion coefficient difference. Even if the defects or distortions caused by lattice mismatching or thermal expansion coefficient difference in the transition layer can be eased, it cannot be said that the warping can be decreased sufficiently.

The aim of the present invention is to provide an alumina substrate formed with an AlN layer in which the warping is decreased.

The present invention is made to solve the above technical problem. It is an alumina substrate with an AlN layer formed on the alumina substrate and containing a carbon-containing phase. The stress caused by lattice mismatching or the like can be concentrated in the carbon-containing phase by containing a carbon-containing phase inside the AlN layer and/or in the interface with the alumina. And an effect can be obtained that the stress and the warping in the AlN layer can be decreased.

As one of the preferred embodiment of the present invention, the carbon-containing phase is preferred to have a composition of $(AlN)_x(Al_4C_3)_y$. Herein, x and y are positive numbers excluding 0. It is further preferred that the carbon-containing phase have a composition of $Al_5C_3N$. Thereby, the stress caused by lattice mismatching or the like can be concentrated in the carbon-containing phase by containing a carbon-containing phase inside the AlN layer and/or in the interface with the alumina. And an obvious effect can be obtained that the stress and the warping in the AlN layer can be decreased.

As one of the preferred embodiment of the present invention, the thickness of the AlN layer is preferred to be 0.02 µm to 100 µm. Thereby, the effect of decreasing the warping can be shown more obviously.

As one of the preferred embodiment of the present invention, the substrate is preferred to be sapphire. Thereby, a substrate material can be provided which is useful for a device where a semiconductor layer is laminated on a single crystal substrate, wherein, the device is a light emitting device or a power transistor.

As one of the preferred embodiment of the present invention, the plane direction of the AlN layer and the carbon-containing phase relative to the main face of the substrate is preferred to be the same with the plane direction of the main face of the substrate. Thereby, the cost can be reduced for producing a device where a semiconductor layer is laminated on a single crystal substrate, wherein, the device is a light emitting device or a power transistor or the like.

According to the present invention, an alumina substrate formed with an AlN layer with decreased warping can be provided.

DETAILED DESCRIPTION OF EMBODIMENTS

The present embodiment intended to use a substrate material as the substrate materials, wherein the substrate material is obtained by nitridizing a sapphire or alumina substrate and forming an AlN layer on the surface of the substrate. However, it is not to form an AlN layer with a high completeness. It is even considered that the usefulness will be higher when used as a substrate by introducing an AlN layer with a low completeness initiatively. When a single crystal is formed on a substrate with a different composition or crystal structure, distortion is not evitable because of the lattice constant difference and the thermal expansion coefficient difference. Further, due to the distortion, defects, warping and cracks are often generated. The present inventors investigated methods which have a function of easing the influence of the alumina or sapphire and will not obstruct the growth of single crystal on the substrate. As a result, it is found that in the alumina substrate formed with AlN layer, warping can be decreased by forming a carbon-containing phase at the same time wherein the warping is caused by lattice mismatching or thermal expansion coefficient difference. Therefore the present invention is completed.

Figure 1A:
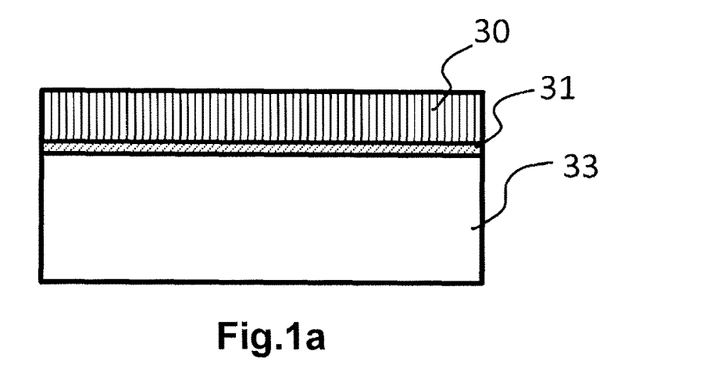
FIG. 1a is a schematic diagram showing an example of the embodiment of the present invention, wherein, a carbon-containing phase is formed as a layer in the interface between the alumina substrate and the AlN layer.
Figure 1B:
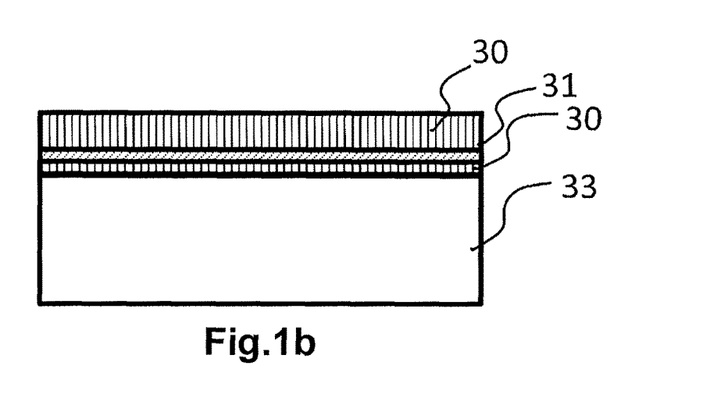
FIG. 1b is a schematic diagram showing an example of the embodiment of the present invention, wherein, a carbon-containing phase is formed as a layer inside the AlN layers.
Figure 1C:
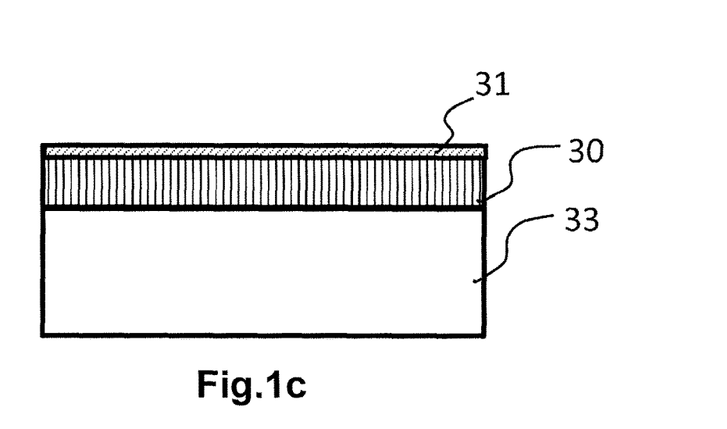
FIG. 1c is a schematic diagram showing an example of the embodiment of the present invention, wherein, a carbon-containing phase is formed as a layer on the outermost surface.

The examples of the embodiment of the present invention are described using FIG. 1 and FIG. 2. FIG. 1 shows the structures with the carbon-containing phase disposed in layer shape. FIG. 1a is an example where layered carbon-containing phase 31 is disposed in the interface between alumina substrate 33 which has not been nitridized and AlN layer 30 which is formed on the alumina substrate. FIG. 1b shows an example in which layered carbon-containing phase 31 is disposed inside AlN layers 30. FIG. 1c shows an example in which layered carbon-containing phase 31 is disposed on the upper surface of AlN layers 30. In FIG. 1a and FIG. 1b, the layered carbon-containing phase 31 is characterized in that it is disposed inside AlN layers 30 or in the interface between alumina substrate 33 which has not been nitridized and AlN layer 30 which is formed on the alumina substrate. As discussed following, according to this kind of structure, stress will be concentrated in layered carbon-containing phase 31 due to the lattice mismatching of alumina substrate 33 and AlN layer 30 and the difference of the thermal expansion coefficients. Just by the concentrated stress, the stress applied to AlN layer 30 situated in the side closer to the surface than layered carbon-containing phase 31 can be reduced. At the same time, the deformation, defect, warping, crack and fracture in AlN layer 30 can be decreased. In FIG. 1c, the layered carbon-containing phase 31 is characterized in that it is disposed on the surface. The lattice spacing of carbon-containing phase 31 is larger than AlN and is similar to the lattice spacing of GaN or InN, thus, it can decrease the lattice mismatching when used as a substrate for forming GaN, AlGaN, InN, InGaN or the like.

Figure 2A:
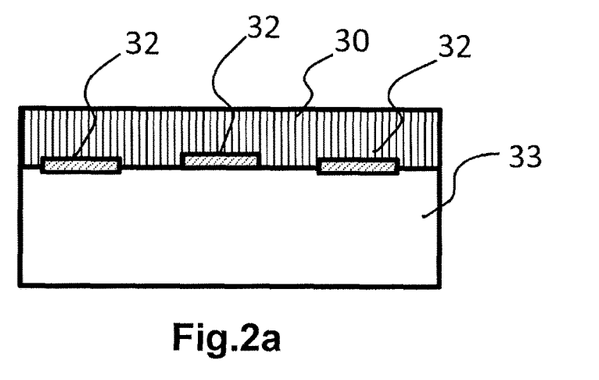
FIG. 2a is a schematic diagram showing an example of the embodiment of the present invention, wherein, a carbon-containing phase is formed as a region in the interface between the alumina substrate and the AlN layer.
Figure 2B:
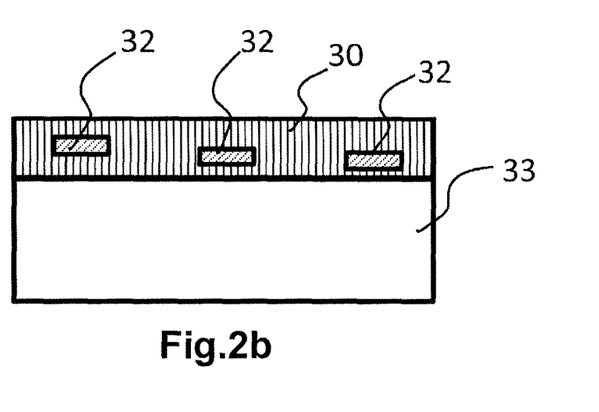
FIG. 2b is a schematic diagram showing an example of the embodiment of the present invention, wherein, a carbon-containing phase is formed as a region inside the AlN layers.
Figure 2C:
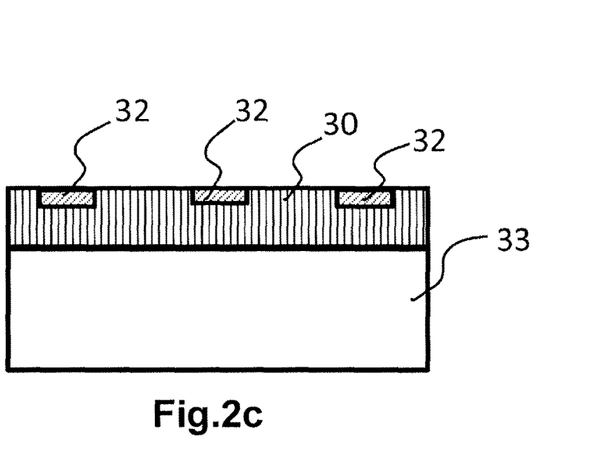
FIG. 2c is a schematic diagram showing an example of the embodiment of the present invention, wherein, a carbon-containing phase is formed as a region on the outermost surface.

FIG. 2 shows the structures with the carbon-containing phase disposed in region shape. FIG. 2a is an example where region-shaped carbon-containing phase 32 is disposed in the interface between alumina substrate 33 which has not been nitridized and AlN layer 30 which is formed on the alumina substrate. FIG. 2b shows an example in which region-shaped carbon-containing phase 32 is disposed inside AlN layers 30. FIG. 2c shows an example in which region-shaped carbon-containing phase 32 is disposed on the surface. In the present embodiment, the case where carbon-containing phase is distributed approximately parallel to the substrate surface and continuously is called as a layer, and the case where the carbon-containing phase is distributed discontinuously is called as a region. In FIG. 2a and FIG. 2b, the region-shaped carbon-containing phase 32 is characterized in that it is disposed inside AlN layers 30 or in the interface between alumina substrate 33 which has not been nitridized and AlN layer 30 which is formed on the alumina substrate. Similar to the case of the layered carbon-containing phase, stress will be concentrated in region-shaped carbon-containing phase 32 due to the lattice mismatching of alumina substrate 33 and AlN layer 30 and the difference of the thermal expansion coefficients. Just by the concentrated stress, the stress applied to AlN layer 30 situated in the side closer to the surface than region-shaped carbon-containing phase 32 can be reduced. At the same time, the deformation, defect, warping, crack and fracture in AlN layer 30 can be decreased. In FIG. 2c, the region-shaped carbon-containing phase 32 is characterized in that it is disposed on the surface. Similar to the case of the layered carbon-containing phase, the lattice spacing is similar to the lattice spacing of GaN or InN, thus, it can decrease the lattice mismatching when used as a substrate for forming GaN, AlGaN, InN, InGaN or the like. Further, the lattice mismatching can be decreased in the extreme by matching the ratio of region-shaped carbon-containing phase 32 and AlN layer 30 on the surface with the lattice spacing of GaN, AlGaN, InN, InGaN or the like which is grown on the surface.

The reason for the concentration of the stress in carbon-containing phase 31 or 32 will be described hereinafter when carbon-containing phase 31 or 32 is disposed inside AlN layers 30 or in the interface between alumina substrate 33 which has not been nitridized and AlN layer 30 which is formed on the alumina substrate. Generally speaking, when two substances with different lattice spacing are combined, stress will be produced because of the lattice mismatching. Further, when the thermal expansion coefficients are different even if their lattice spacing are the same, the lattice spacing will be different due to the temperature fluctuation, thus, lattice mismatching will still be happened to produce stress. Compared to the alumina substrate, AlN crystal can obtain larger lattice spacing, and the carbon-containing phase will obtain an even more larger lattice spacing. Thus, when carbon-containing phase is disposed inside AlN layers 30 or in the interface between alumina substrate 33 which has not been nitridized and AlN layer 30 which is formed on the alumina substrate shown in FIG. 1a and FIG. 1b, stress will be produced nearby the interface formed between alumina substrate 33 and carbon-containing phase 31 or 32. Further, stress will also be produced nearby the interface of carbon-containing phase 31 or 32 and AlN layer 30. That is, two kinds of stress are produced in carbon-containing phase 31 or 32, thus, the stress applied on carbon-containing phase 31 or 32 is larger than the stress produced in AlN layer 30 in the case when only AlN layer 30 is formed on alumina substrate 33. The stress obtained from alumina substrate 33 will be offset just as much as the surplus stress produced in carbon-containing phase 31 or 32, and the warping of AlN layer 30 will be decreased.

In the case of one example of the present embodiment where carbon-containing phase is disposed inside AlN layers or in the interface between alumina substrate and AlN layer, stress will also be accumulated in the carbon-containing phase during grain-growth or cooling and cracks may also be generated. In this case, cracks will start from the carbon-containing phase. The stress will be eased. The progress of the distortions, defects or cracks toward the grown grain can be decreased. Further the cracks entered into the carbon-containing phase will progress in lateral direction and will cause a peeling without fatal damage for the grown grain. Thereby the AlN layer turns to be independent.

It is especially effective when the carbon-containing phase has a composition represented by $(AlN)_x(Al_4C_3)_y$. Herein, x and y are positive numbers. The lattice constant of the a axis of the $Al_5C_3N$ phase (X=Y=1) is 0.328 nm; the lattice constant of the a axis of the $Al_6C_3N_2$ phase (X=2, Y=1) is 0.325 nm; the lattice constant of the a axis of the $Al_7C_3N_3$ phase (X=3, Y=1) is 0.323 nm; the lattice constant of the a axis of $Al_8C_3N_4$ phase (X=4, Y=1) is 0.321 nm, which are larger than 0.311 nm of AlN and 0.319 nm of GaN and smaller than 0.355 nm of InN. Thus, when GaN, AlGaN, InN, InGaN or the like are laminated, the lattice mismatching can be reduced by disposing $(AlN)_x(Al_4C_3)_y$ on the outermost surface. Further, the crystals can be grown without enlarging the lattice mismatching even under the case where mixed crystals such as AlGaN and InGaN are grown on the alumina substrate of the present embodiment by adjusting the ratio of x and y and/or the ratio of the AlN layer and the $(AlN)_x(Al_4C_3)_y$ phase on the outermost surface.

$Al_5C_3N$ phase (X=Y=1) has a high effectiveness in reducing the warping because of the accumulating of the stress into the carbon-containing phase and the alleviation of the stress of the AlN layer when the carbon-containing phase is disposed inside AlN layer 30 or in the interface between alumina substrate 33 which has not been nitridized and AlN layer 30 which is formed on the alumina substrate. Further, it is also an effective material for growing crystals mixed with InN on the alumina substrate of the present embodiment.

The layer thickness of the AlN layer is 0.02 μm or more and 100 μm or less, and preferably 0.05 μm or more and 10 μm or less, and more preferably 0.05 μm or more and 1 μm or less. Thereby, the warping can be reduced.

When a sapphire substrate is used, it is preferred that the AlN layer to be formed coincides with the plane direction of the substrate main face. Thereby, the cost can be reduced for the fabrication of the devices such as a light emitting device or a power transistor or the like where a semiconductor layer is laminated on a single crystal substrate.

Hereinafter, embodiments for carrying out the alumina substrate of the present embodiment will be specifically described, but the present invention is not limited to the following embodiments.

Figure 3:
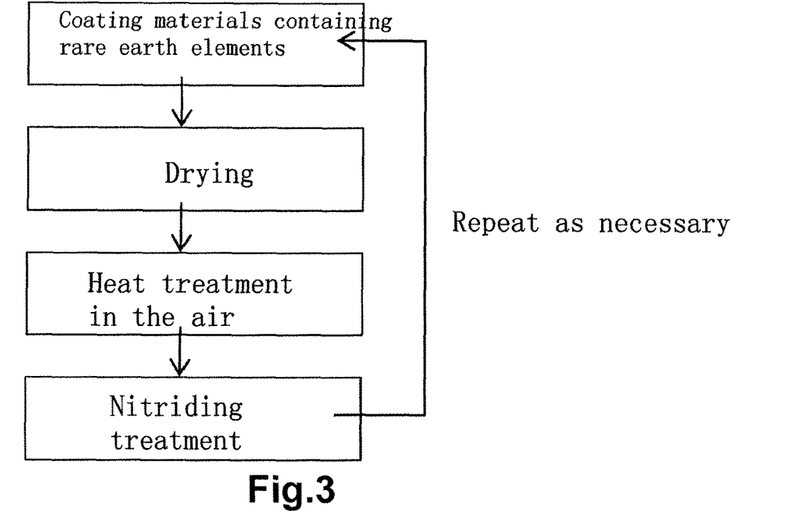
FIG. 3 is an example of a flow chart of one example of the embodiment of the present invention.

FIG. 3 demonstrates a flow for producing the alumina substrate of this embodiment. As the main process, it is composed of the following a) to d), i.e., a) a process of coating materials containing rare earth elements on the alumina substrate or sapphire substrate; b) drying process; c) a process of heat treatment for the coated substrate in the air; and d) nitriding treatment process. Further, these processes can be repeated.

As the alumina substrate which is a base, a sapphire substrate or a polycrystalline sintered alumina substrate is used. A raw material containing a rare earth element is coated on the substrate. As the coating method, a spin coating method, a spraying method, a vapor deposition method, a sputtering method and the like can be exemplified, but the coating method is not limited thereto. Herein, spin coating method which can perform the coating most conveniently is demonstrated.

In the spin-coating method, a solution of raw materials is required. Thus, the ethanol solution of nitrate of rare earth elements and MOD solution of rare earth elements prepared by Kojundo Chemical Laboratory Co., Ltd. were used. MOD solution is a solution where organic salts of the rare earth elements are dissolved in a solution with xylene as the main component. The alumina substrate was set on the sampling stage and then coated with the solution of raw material under a rotation speed of 1000 to 3000 rpm. The raw material solution can be coated thinly and uniformly onto the alumina substrate by rotating. The solution has a high volatility, thus, it can prevent the reaggregation of the solution after coating. Aqueous solution can be used from the viewpoint of the reaggregation. If the vapor deposition method or the sputtering method is used, raw materials of rare earth elements in forms of oxides or metal can be used.

The method of supplying the rare earth material is not limited to coating. As another means, for example, a part or the whole of the raw materials containing rare earth element may be disposed in the vicinity of the substrate, or placed on the substrate or adhered to a holding jig such as a sagger or the like during the nitriding treatment.

The rare earth elements are not restricted to be one kind. Several kinds of rare earth elements can be used at the same time. Further, as a raw material other than the rare earth element, a raw material containing aluminum element may be added.

When salts are used as the raw materials, they are preferably heat treated in air under 500° C. to 1400° C. By such a heat treatment, the coated solution can be heat-decomposed completely, and the raw materials can be prepared to be rare earth elements oxides even if they are inorganic salts or organic salts.

Figure 4:
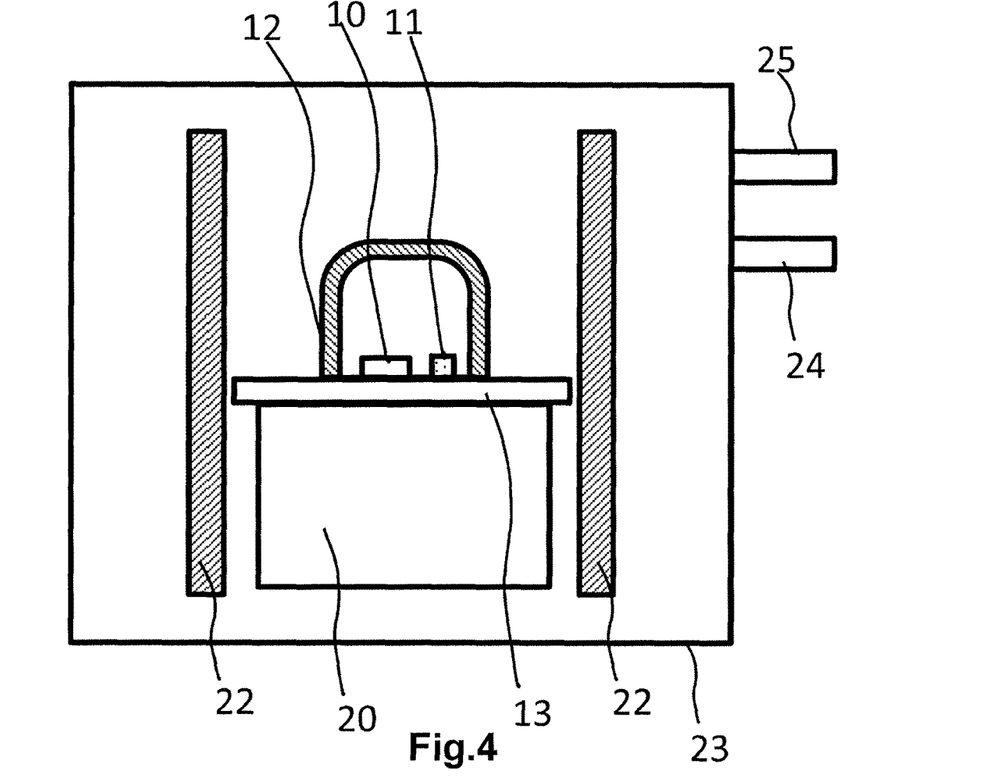
FIG. 4 is a schematic diagram showing the heating part during the nitriding process.

The nitriding treatment is performed by heating the alumina substrate whose surface was coated by rare earth elements in nitrogen, wherein the alumina substrate has been heat treated in air. It is described using FIG. 4 and FIG. 5. FIG. 4 is a schematic diagram showing the heating part. The heating furnace is composed of carbon heater 22, sampling stage 20 and chamber 23 which covers the whole. In chamber 23, gas exhaust port 24 and gas intake port 25 are disposed. Gas exhaust port 24 is connected with a rotary pump (which is not shown in the figure) and a diffusion pump (which is not shown in the figure) and turns out to be a structure which can perform degassing. Further, through gas intake port 25 it turns out to be a structure which can introduce nitrogen gas.

Alumina plate 13 is disposed on the sampling stage, alumina substrate 10 and carbons 11 are loaded on it. Further, at the same time, approximately hermetically-closed saggar 12 is disposed on alumina plate 13 to cover the whole of alumina substrate 10 and carbon 11. Besides, the approximately hermetically-closed state doesn't refer to a sealing property which can block the gas flow entirely, but refers to a sealing property which can suppress the gas flow to some extent. Further, in the case where raw materials containing rare earth elements (which are not shown in the figure) are disposed during the nitriding treatment process, they are disposed to be covered by an approximately hermetically-closed saggar like carbon 11. Further, in the case when raw materials containing rare earth elements or carbon are disposed to adhered to the holding jigs, they can be coated on alumina plate 13 or in the inner side of approximately hermetically-closed saggar 12.

The heating temperature can be different according to the rare earth elements, and is about 1400 to 1800° C. If it is lower than this temperature, the AlN layer cannot be formed sufficiently. On the other hand, if the heating temperature is too high, as the processed substrate, alumina substrate will be deteriorated. Further, it is preferred that carbon is disposed beside the substrate during processing. The amount of carbon would be different according to the processed size and the processed condition, thus, it is not limited and is 0.1 mg or more. If it is too little, the carbon-containing phase cannot be formed and AlN layer cannot be formed sufficiently either. Further, the crystallinity may also be decreased. In addition, when the nitriding process is repeated, it may also work if no carbon is disposed. If carbon is too much, the excessive carbon can not turn to be gas and maintained to be the original state; thus, no influence will be brought to the producing of AlN. However, sometimes, the amount of carbon needs to be adjusted according to the decrease of the flatness of the substrate surface or the aim to influence the precipitation of the carbon-containing phase.

Figure 5:
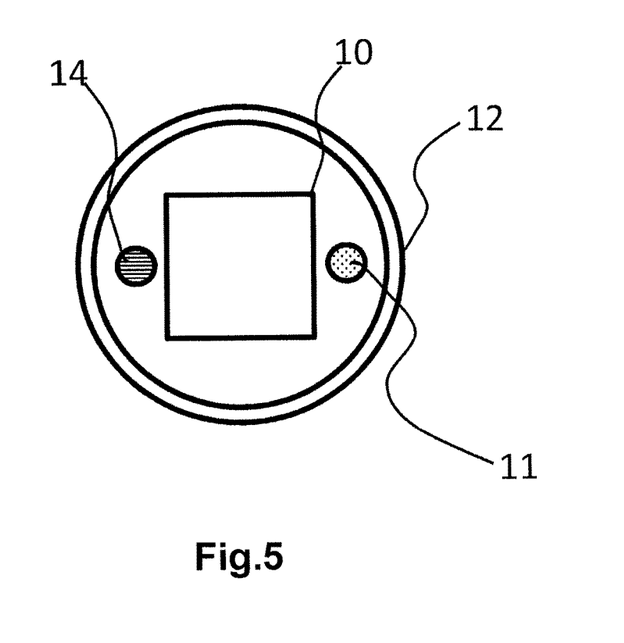
FIG. 5 is a plane view showing the disposition relationship of nitrided substrate 10 with carbon 11 and rare earth elements 14.

The disposing method of the carbon and the form of the carbon are not limited. FIG. 5 shows an example of the disposing method. In the method, carbon 11 is disposed in one place together around alumina substrate 10 with a φ size of 10 mm and the rare earth elements raw materials are disposed in one place around the opposite side. The carbon can be disposed in one place together, and can also be coated on a holder of a saggar or the like. In addition, a carbon with a block shape or a rod shape may also be disposed.

According to such a treatment, AlN layer 30 can be formed on the surface of alumina substrate 10. Further, AlN will be generated on the substrate surface even if no Al is contained in the coating raw material. Thus, the AlN is not formed to adhere to the alumina substrate surface but is formed by substituting the oxygen in the alumina substrate nearby the surface with nitrogen. On the other hand, the rare earth elements will disappear. It is thought that they form nitrides or carbides and turn to be gas to disappear.

As a result of intensive studies on the conditions and measures for obtaining the carbon-containing phase intentionally, it was found that by adjusting the nitriding treatment temperature, the treatment time, the atmosphere, the amount of carbon and the amount of the rare earth elements, a carbon-containing phase can be formed, and the ratio of the AlN layer can be adjusted.

It was also effective for adjusting the ratio of the AlN layer and the carbon-containing phase by repeating the treatment to the once treated substrate. Thereby, a substrate can be provided which contains a carbon-containing phase in a proportion optimized for the application of the substrate of the present embodiment and has an AlN layer.

In the present embodiment, the atmosphere is maintained by the hermetically-closed heating furnace and the approximately hermetically-closed saggar, but it is not limited to like this. It is considered that as long as the carbon amount and the rare earth elements amount can be controlled, a substrate formed with an AlN layer and a carbon-containing phase can be obtained even if the heating part is in a gas flow or in an open environment.

Figure 6A:
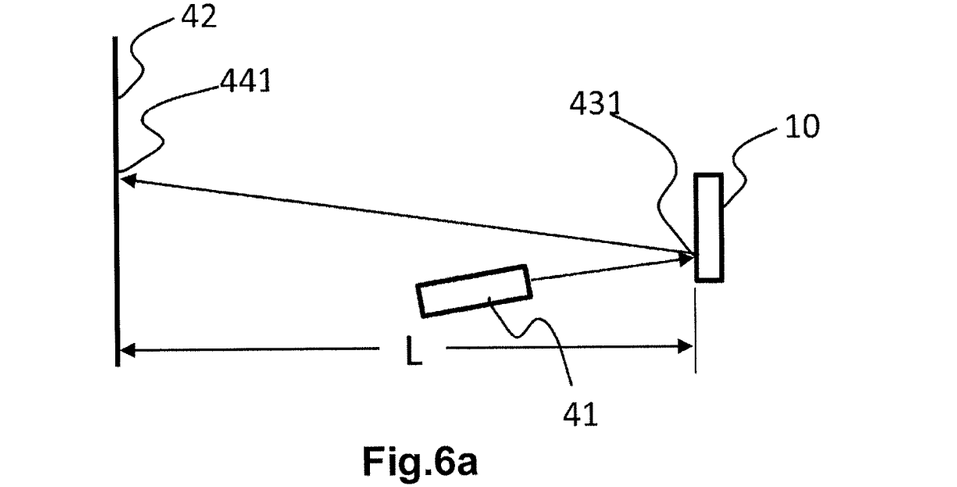
FIG. 6a is a schematic diagram showing the first measuring system which will be the reference in the measuring method for the curvature radius of the alumina substrate in the present embodiment.
Figure 6B:
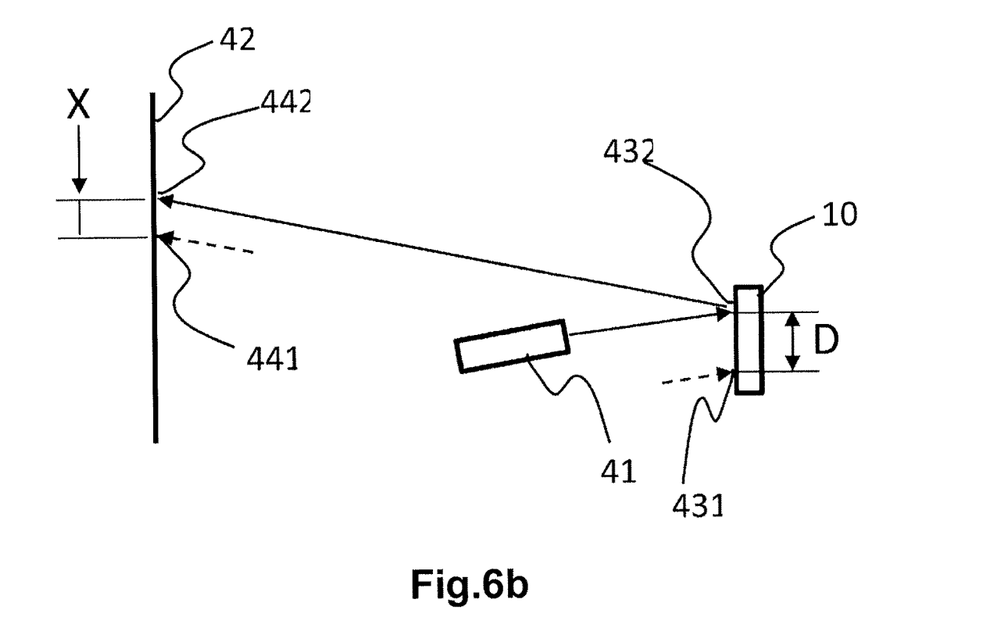
FIG. 6b is a schematic diagram showing the optical measuring system after the moving of the irradiation position in the measuring method for the curvature radius of the alumina substrate in the present embodiment.

The warping can be evaluated by calculating the curvature radius through a method using the surface reflected light. It is described using FIG. 6. Light is irradiated from visible LD or LED light source 41 to an arbitrary point 431 on the side formed with AlN layer of alumina substrate 10 of the present embodiment. The reflected light forms an image on screen 42 and the image position 441 is marked. Subsequently, (as shown in FIG. 6a) the alumina substrate is moved only with a distance D in a direction parallel to the screen in a state with the optical system fixed, the irradiation position is changed to position 432. In the same way, the reflected light from the irradiation position 432 forms an image on the screen and the image position 442 is marked. The distance of the two positions formed with images 441 and 442 is deemed as the displacement X (as shown in FIG. 6b). Further, the distance of alumina substrate 10 and screen 42 is set as L; the curvature radius of the warping of alumina substrate 10 is set as R. If the L and R are sufficiently larger than the D and X, curvature radius R can be approximately calculated by the following formula.

$$R=2LD/X$$

Further, if the displacement vector of irradiation position 432 with irradiation position 431 being the start point and the displacement vector of image position 442 with image position 441 being the start point are parallel, the warping of alumina substrate 10 is convex. If they are antiparallel, the warping of alumina substrate 10 is concavity.

EXAMPLES

Example 1

A c-plane sapphire substrate was cut into 10 mm square to be used as the substrate. MOD solution was coated on the substrate by spin coating method under 3000 rpm for 20 seconds, wherein the MOD solution contained Y as the rare earth element with a concentration of 2 wt %. After being coated, the substrate was dried on a hotplate of 150° C. for 10 minutes. Then it was heat treated in air for 2 hours under 600° C. After the heat treatment, the substrate was put on square alumina plate 13 with a 100 mm square. Further, 5 mg of powder carbon 11 was disposed in one place beside the substrate. A cylindrical alumina crucible with a diameter of 30 mm and a height of 30 mm was used as approximately hermetically-closed saggar 12. The alumina crucible implemented the approximately hermetically-closed state by being turned upside down to cover the substrate and the powder carbon. As shown in FIG. 2, the nitriding furnace is an electric furnace of resistance heating type with carbon as the heater. In order to replace the gas, before heating, degassing was performed using a rotary pump and a diffusion pump to 0.03 Pa, and then nitrogen gas was flowed into the saggar to obtain a pressure of 100 kPa (atmospheric pressure) and after that the flow of nitrogen gas is stopped. After the gas replacing, the furnace was heated to perform the heat-treatment. The treating temperature was 1750° C., the treating duration was set to be 4 hours, and the heating and cooling rate were set as 600° C./h. After cooled to the room temperature, the treated substrate was taken out to be evaluated.

An XRD measurement was performed using Cu as the target. As the result, in the range with 2θ of 15 degree to 45 degree, $Al_5C_3N$ (002n) (where n=2, 3, 4, 5) diffraction rays, AlN (002) diffraction ray, and sapphire (006) diffraction ray were confirmed. Further, the intensity ratio of the $Al_5C_3N$ (006) diffraction ray relative to the sapphire (006) diffraction ray was 0.5%. And the intensity ratio of the AlN (002) diffraction ray relative to the sapphire (006) diffraction ray was 28%. Thereby, it could be confirmed that besides the AlN phase, $Al_5C_3N$ phase orientated in the c axis was generated. Further, the curvature radius was calculated using the measuring system shown in FIG. 6, and it was 65 m.

In addition, the cross-section was processed by FIB and was observed by SEM. The result found an AlN layer with a thickness of 0.3 μm on the sapphire surface from the backscattered electron image.

Example 2

The c-plane sapphire was cut into 10 mm square shape to prepare the substrate for nitriding treatment. Europium nitrate hydrate was dissolved in ethanol to obtain a concentration of 2 wt %. After that, some surfactant was added to fabricate a coating solution. The spin coating was performed under 3000 rpm for 20 seconds. After dried on a hotplate of 250° C. for 10 minutes, the sample was performed with a heat treatment in air for 2 hours under 1000° C. The nitriding treatment was performed in the same way as Example 1. However, the treating temperature was 1650° C.

In the XRD measurement, in the range with 2θ of 15 degree to 45 degree, $Al_5C_3N$ (002n) (where n=2, 3, 4, 5) diffraction rays, AlN (002) diffraction ray, and sapphire (006) diffraction ray were confirmed. Further, the intensity ratio of the $Al_5C_3N$ (006) diffraction ray relative to the sapphire (006) diffraction ray was 0.2%. And the intensity ratio of the AlN (002) diffraction ray relative to the sapphire (006) diffraction ray was 25%. The curvature radius was 30 m.

In addition, the cross-section was processed by FIB and was observed by SEM. The result found an AlN layer with a thickness of 0.2 μm on the sapphire surface from the backscattered electron image. Compared with Example 1, it could be found that the radius of curvature decreased, i.e., the warping increased even though the thickness of the AlN layer decreased. Since the intensity ratio of the $Al_5C_3N$ (006) diffraction ray relative to the sapphire (006) diffraction ray was lower than that in Example 1, it could be concluded that the $Al_5C_3N$ phase had the effect of reducing warping.

Example 3

An alumina substrate treated in the same was as in Example 1 was prepared and treated again in the same way as in Example 1 repeatedly. However, in this treatment, no powdery carbon was disposed and only the substrate was covered by the alumina crucible and a nitriding treatment was performed.

As same as Example 1, in the XRD measurement, in the range with 2θ of 15 degree to 45 degree, $Al_5C_3N$ (002n) (where n=2, 3, 4, 5) diffraction rays, AlN (002) diffraction ray, and sapphire (006) diffraction ray were confirmed. Further, the intensity ratio of the $Al_5C_3N$ (006) diffraction ray relative to the sapphire (006) diffraction ray was 6.5%. And the intensity ratio of the AlN (002) diffraction ray relative to the sapphire (006) diffraction ray was 7.1%. A decreasing of AlN phase could be confirmed if the $Al_5C_3N$ phase is increased. The curvature radius was 128 m which was increased compared to Example 1.

Example 4

A substrate prepared in Example 2 was used and treated again in the same way as in Example 2 repeatedly. However, in this treatment, 8 mg of powdery carbon was disposed to perform a nitriding treatment.

As same as Example 1, in the XRD measurement, in the range with 2θ of 15 degree to 45 degree, $Al_5C_3N$ (002n) (where n=2, 3, 4, 5) diffraction rays, AlN (002) diffraction ray, and sapphire (006) diffraction ray were confirmed. Further, the intensity ratio of the $Al_5C_3N$ (006) diffraction ray relative to the sapphire (006) diffraction ray was 0.1%. And the intensity ratio of the AlN (002) diffraction ray relative to the sapphire (006) diffraction ray was 30%. Contrary to Example 3, an increasing of AlN phase could be confirmed if the $Al_5C_3N$ phase is decreased. The curvature radius was 22 m which was decreased compared to Example 2, i.e., the warping increased.

Example 5

A substrate prepared in Example 2 was used and treated again in the same way as in Example 2 repeatedly. The arrangement at this time was the same as in FIG. 3, and 8 mg of powdered carbon and 5 mg of $Eu_2O_3$ powder was used.

As same as Example 1, in the XRD measurement, in the range with 2θ of 15 degree to 45 degree, $Al_5C_3N$ (002n) (where n=2, 3, 4, 5) diffraction rays, AlN (002) diffraction ray, and sapphire (006) diffraction ray were confirmed. Further, the intensity ratio of the $Al_5C_3N$ (006) diffraction ray relative to the sapphire (006) diffraction ray was 3.2%. And the intensity ratio of the AlN (002) diffraction ray relative to the sapphire (006) diffraction ray was 24%. Both of the $Al_5C_3N$ phase and the AlN phase were increased. Further, the curvature radius was increased to 82 m.

The alumina substrate of the present embodiment not only can be used as the substrate for growing single crystals such as AlN or the, like, but also can be used in the substrate for light emitting element and semiconductor element, or the products in the field which using the high thermal conductivity of AlN.

DESCRIPTION OF REFERENCE NUMERALS 10 alumina substrate
11 carbon
12 approximately hermetically-closed saggar
13 alumina plate
14 raw material of rare earth elements
20 sampling stage
22 carbon heater
23 chamber
24 gas exhaust port
25 gas intake port
30 AlN layer
31 layered carbon-containing phase
32 region-shaped carbon-containing phase
33 alumina substrate without being nitridized
41 visible LD or LED light source
42 screen
431 the irradiation position of the light in an arbitrary point on the side formed with AlN layer of alumina substrate 10 of the present embodiment
432 the irradiation position of the light after the alumina substrate 10 of the present embodiment is moved parallel to screen 42
441 the image position of the reflected light imaged on the screen corresponding to the irradiation position 431 of the light
442 the image position of the reflected light imaged on the screen corresponding to the irradiation position 432 of the light

What is claimed is:

1. A substrate comprising an alumina substrate and an AlN layer formed over a surface of the alumina substrate, wherein a carbon-containing phase is distributed discontinuously in the AlN layer, at an outermost surface of the AlN layer or at an interface of the alumina substrate and the AlN layer.

2. The alumina substrate of claim 1, wherein, the carbon-containing phase has a composition represented by $(AlN)_x(Al_4C_3)_y$, wherein, x and y are positive numbers excluding 0.

3. The alumina substrate of claim 2, wherein, the carbon-containing phase has a composition represented by $Al_5C_3N$.

4. The alumina substrate of claim 3, wherein, a thickness of the AlN layer is 0.02 μm to 100 μm.

5. The alumina substrate of claim 4, wherein, the alumina substrate is sapphire.

6. The alumina substrate of claim 3, wherein, the alumina substrate is sapphire.

7. The alumina substrate of claim 2, wherein, a thickness of the AlN layer is 0.02 μm to 100 μm.

8. The alumina substrate of claim 7, wherein, the alumina substrate is sapphire.

9. The alumina substrate of claim 2, wherein, the alumina substrate is sapphire.

10. The alumina substrate of claim 1, wherein, the carbon-containing phase has a composition represented by $Al_5C_3N$.

11. The alumina substrate of claim 10, wherein, a thickness of the AlN layer is 0.02 μm to 100 μm.

12. The alumina substrate of claim 11, wherein, the alumina substrate is sapphire.

13. The alumina substrate of claim 10, wherein, the alumina substrate is sapphire.

14. The alumina substrate of claim 1, wherein, a thickness of the AlN layer is 0.02 μm to 100 μm.

15. The alumina substrate of claim 14, wherein, the alumina substrate is sapphire.

16. The alumina substrate of claim 1, wherein, the alumina substrate is sapphire.

17. The alumina substrate of claim 16, wherein, a plane direction of the AlN layer relative to a main face of the alumina substrate is coincident with a plane direction of the main face of the alumina substrate.

* * * * *